US010281823B2

(12) United States Patent
Deguenther

(10) Patent No.: US 10,281,823 B2
(45) Date of Patent: May 7, 2019

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 4 days.

(21) Appl. No.: 15/803,304

(22) Filed: Nov. 3, 2017

(65) Prior Publication Data
US 2018/0059551 A1 Mar. 1, 2018

Related U.S. Application Data

(63) Continuation of application No. PCT/EP2016/000795, filed on May 13, 2016.

(30) Foreign Application Priority Data

May 13, 2015 (DE) .......... 10 2015 208 950

(51) Int. Cl.
G03B 27/54 (2006.01)
G03F 7/20 (2006.01)

(52) U.S. Cl.
CPC .......... G03F 7/70075 (2013.01); G03F 7/702 (2013.01); G03F 7/70116 (2013.01); G03F 7/70191 (2013.01); G03F 7/70208 (2013.01)

(58) Field of Classification Search
CPC ............. G03F 7/70075; G03F 7/70116; G03F 7/70191; G03F 7/702; G03F 7/70208
See application file for complete search history.

(56) References Cited

U.S. PATENT DOCUMENTS 7,061,582 B2 6/2006 Zinn et al.
2003/0043356 A1 3/2003 Shiraishi
(Continued)

FOREIGN PATENT DOCUMENTS

EP 1 262 836 A1 12/2002
EP 2 146 248 A1 1/2010
(Continued)

OTHER PUBLICATIONS

International Search Report for corresponding Appl No. PCT/EP2016/00795, dated Sep. 19, 2016 (10 pages).

Primary Examiner — Peter B Kim
(74) Attorney, Agent, or Firm — Fish & Richardson P.C.

(57) ABSTRACT

An illumination system of a microlithographic projection exposure apparatus includes first and second optical raster plates. An irradiance distribution of projection light on the first and second optical raster plates determines an angular light distribution of the projection light exclusively at a first portion and a second portion, respectively, of an illuminated field. The second portion is distinct from and arranged adjacent to the first portion. It is possible to produce different illumination settings in different adjacent portions on the mask. First and second Fourier optics establish a Fourier relationship between the first and second optical raster plates one the one hand and the first and second portion on the other hand. The first and second Fourier optics have a first and second focal length, respectively, that are variable in response to a focal length change command signal from a control unit.

20 Claims, 8 Drawing Sheets

(56) References Cited

U.S. PATENT DOCUMENTS

| | | |
|---|---|---|
| 2004/0125459 A1 | 7/2004 | Tanitsu et al. |
| 2006/0087634 A1 | 4/2006 | Brown et al. |
| 2009/0115990 A1 | 5/2009 | Owa et al. |
| 2010/0283985 A1 | 11/2010 | Layh et al. |
| 2013/0114060 A1 | 5/2013 | Patra et al. |

FOREIGN PATENT DOCUMENTS

| | | |
|---|---|---|
| WO | WO 2005/026843 A2 | 3/2005 |
| WO | WO 2012/034571 A1 | 3/2012 |
| WO | WO 2014/111098 | 7/2014 |

ILLUMINATION SYSTEM OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2016/00795, filed May 13, 2016, which claims benefit under 35 USC 119 of German Application No. 10 2015 208 950.9, filed May 13, 2015. The entire disclosure of these applications are incorporated by reference herein.

FIELD

The disclosure generally relates to an illumination system of a microlithographic projection exposure apparatus, and in particular to an illumination system in which a fly's eye lens or another type of optical raster element is used to homogenously illuminate the mask.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further includes a mask stage for aligning the mask, a projection objective (sometimes also referred to as 'the lens') that images the illuminated field on the mask onto the photoresist, and a wafer alignment stage for aligning the wafer coated with the photoresist.

One of the aims in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

Various approaches have been pursued in the past to achieve this aim. One approach is to improve the illumination of the mask. Ideally, the illumination system of a projection exposure apparatus illuminates each point of the field illuminated on the mask with projection light having a well defined spatial and angular irradiance distribution. The term angular irradiance distribution describes how the total light energy of a light bundle, which converges towards a particular point on the mask, is distributed among the various directions of the rays that constitute the light bundle.

The angular irradiance distribution of the projection light impinging on the mask is usually adapted to the kind of pattern to be imaged onto the photoresist. For example, relatively large sized features may involve a different angular irradiance distribution than small sized features. The most commonly used angular irradiance distributions are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular irradiance distribution of the projection light, and all light rays impinge obliquely with similar angles onto the mask.

Different means are known in the art to modify the angular irradiance distribution of the projection light in the mask plane so as to achieve the desired illumination setting. For achieving maximum flexibility in producing different angular irradiance distribution in the mask plane, it has been proposed to use a spatial light modulator including a mirror array for producing a desired irradiance distribution in the pupil surface.

In EP 1 262 836 A1 the mirror array is realized as a micro-electromechanical system (MEMS) including more than 1000 microscopic mirrors. Each of the mirrors can be tilted about two orthogonal tilt axes. Thus projection light incident on such a mirror device can be reflected into almost any desired direction of a hemisphere. A condenser lens arranged between the mirror array and a pupil surface translates the reflection angles produced by the mirrors into locations in the pupil surface. This illumination system makes it possible to illuminate an optical integrator formed by an optical raster element and arranged in or immediately in front of the pupil surface, with a plurality of light spots. Each light spot is associated with one particular mirror and is freely movable across a light entrance surface of the optical integrator by tilting this mirror.

Similar illumination systems using mirror arrays as spatial light modulators are known from US 2006/0087634 A1, U.S. Pat. No. 7,061,582 B2 and WO 2005/026843 A2.

Also the illumination system disclosed in EP 2 146 248 A1 produces light spots on the light entrance facets of the optical integrator. Here the total area of each light spot is much smaller than the area of the light entrance facets. By suitably assembling the light spots in various ways, it is possible to produce different irradiance patterns on the individual light entrance facets. Since these irradiance patterns are individually imaged on a subsequent field plane, the spatial irradiance distribution in this field plane can be simply modified by changing the irradiance patterns on the light entrance facets.

However, this approach involves a mirror array including a very large number of mirrors. This significantly increases the complexity and costs of the mirror array and also of the control systems to control the mirrors. Furthermore, because of diffraction it is difficult to produce light spots that are sufficiently small. In principle it may be considered not to decrease the size of the light spots, but to increase the size of the light entrance facets.

However, this would severely compromise the homogeneity of the illumination, because then a smaller number of individual light bundles are superimposed on the mask.

One approach is to use one or more additional digital mirror arrays in a beam path between the spatial light modulator and the optical integrator, as this is described in US 2013/0114060 A1 and in the yet unpublished patent applications EP 13194135.3 and EP 14155682.5 that have been filed on Nov. 22, 2013 and Feb. 10, 2014, respectively. Since the digital mirror array is imaged on the light entrance facets of the optical integrator, it is possible to produce finely patterned irradiance distributions thereon.

Although the additional digital mirror array provides superior flexibility in producing field-dependent illumination settings, it also adds significantly to the overall system complexity and costs and is therefore warranted only if this flexibility is really involved.

Another approach to produce field-dependent illumination settings is described in US 2013/0114060 A1. Modulator units are arranged in the beam paths of the light bundles that are produced by the optical integrator. The modulator units are configured to variably redistribute, without blocking any light, the spatial and/or angular light distribution of these light bundles. However, the provision of the modulator units in the light paths is quite demanding from a technological point of view if the number of light paths shall be great.

SUMMARY

The disclosure seeks to provide an illumination system of a microlithographic projection exposure apparatus which makes it possible, without unduly increasing the system complexity, to produce different illumination settings on different portions on the mask.

In one aspect, the disclosure provides an illumination system including a first optical raster plate, wherein an irradiance distribution of projection light on the first optical raster plate determines an angular light distribution of the projection light exclusively at a first portion of an illuminated field. The illumination system further includes a second optical raster plate, wherein an irradiance distribution of the projection light on the second raster plate determines an angular light distribution of the projection light exclusively at a second portion of the illuminated field, wherein the second portion is distinct from and arranged adjacent to the first portion. The illumination system includes first Fourier optics that establish a Fourier relationship between a first pupil plane, which intersects, or is arranged in close proximity to, the first optical raster plate, and the first portion of the illuminated field. The illumination system further includes a second Fourier optics that establishes a Fourier relationship between a second pupil plane, which intersects, or is arranged in close proximity to, the second optical raster plate, and the second portion of the illuminated field.

Such first and second Fourier optics, which may also be referred to as condenser or f-optics, are useful to keep the axial distance of the illumination system short. In principle, it is also possible to use optical systems that do not establish a perfect Fourier relationship, or even to completely dispense with the Fourier optics, but then the first and second optical raster plates should be arranged far away from the illuminated field. In this context the term "close proximity" denotes a maximum axial distance which is 20 times smaller than the diameter of the projection light beam at the pupil plane.

In accordance with the disclosure, the first Fourier optics and the second Fourier optics have a first focal length and a second focal length, respectively, that are variable in response to a focal length change command signal from the control unit. By changing the focal length of the first and second Fourier optics, it is possible to change the size of the first and second portions illuminated on the field.

The disclosure is based on the conception that the provision of two optical raster plates, which separately illuminate different portions of a field, makes it possible to produce different illumination settings at these portions if different irradiance distributions are produced on the optical raster plates. Instead of using a single optical raster plate with optical channels each illuminating the entire field, the disclosure proposes optical channels that illuminate only portions of the field.

Generally the first and second optical raster plates will produce the portions of the illuminated field on the mask or on a plane that is optically conjugate to the mask. In principle, however, it is also possible to produce the illuminated field on another surface, for example a digital mirror device that is arranged slightly offset with respect to a plane that is optically conjugate to the mask. This digital mirror device, or another type of spatial light modulator, may be used to form variable light patterns on the optical raster elements that constitute the optical raster plates. Thus the present disclosure can also be used in illumination systems with digital mirror devices, as they are described, for example, in US 2013/0114060 A1 that has been mentioned at the outset.

The term "optical raster plate" is used herein to denote an optical element that includes a regular or irregular array of optical raster elements. An optical raster element is a lens, a prism, or a diffractive optical element that is arranged, together with other identical or similar optical raster elements, on a common support so that they commonly form the optical raster plate. Each optical raster element has the property that it directs impinging light into one or a plurality of directions.

Preferably the first and second optical raster plates are distinct elements that are separated from each other by some distance. This makes it easier to prevent optical cross-talk between the optical raster plates, i.e. that light emerging from the first optical raster plate impinges on the second portion, and vice versa. However, in principle it is also possible to form the two optical raster plates on a single support, or even to use different portions of a larger uniform optical raster plate as first and second optical raster plate. In that case additional mean such as a separating wall may be desirable to prevent optical cross-talk between the first and second optical raster plates.

In one embodiment the illumination system includes a spatial light modulator which is configured to produce the irradiance distribution on the first optical raster plate. This makes it possible to produce different irradiance distributions on the first optical raster plate, and thus different illumination settings in the first portion. However, it is also possible to produce the irradiance distribution on the first optical raster plate with the help of other optical elements, for example a diffractive optical element. Usually the irradiance distribution which can be produced with a single diffractive optical element is fixed. However, there are also diffractive optical elements available that have position dependent diffractive properties. This makes it possible to vary, at least to some extent, the irradiance distribution on the first optical raster plate by displacing the diffractive optical element.

The spatial light modulator may be configured to vary positions of light spots on the first optical raster plate in response to a command signal received from a control unit. With such a spatial light modulator it is possible to produce almost any arbitrary irradiance distribution on the first optical raster plate without any significant light losses. However, it is also possible to use a digital filter realized as a digital mirror device, for example, that is imaged on the first optical raster plate. In that case, however, significant light losses are inevitable.

The spatial light modulator may include an array of beam deflecting elements. Each beam deflecting element is individually capable of deflecting impinging light in a direction which depends on the command signal received from the control unit. Each light spot is then associated with exactly one beam deflecting element. Typically the beam deflecting elements are mirrors, but it is also possible to use beam deflecting elements that rely on the accusto-optical effect, for example. If realized as a micro-mirror array, the tilting angles of each mirror have to be set very precisely at a desired angle. This may involve the application of a closed-loop control and the measurement of the tilting angle with a separate monitoring system, as this is known in the art as such.

It is possible to use a first spatial light modulator that exclusively illuminates the first optical raster plate, and a second spatial light modular that exclusively illuminates the second optical raster plate. In one embodiment the spatial light modulator is configured to produce the irradiance distribution not only on the first optical raster plate, but also on the second optical raster plate.

In one embodiment a reflective light guiding system is provided that directs projection light emerging from the first optical raster plate and projection light emerging from the second optical raster plate to the illuminated field. Such a reflective light guiding system is useful particularly in those cases in which the first and second optical raster plates are separated from each other by a larger distance.

The light guiding system may include a first subsystem that directs the projection light emerging from the first optical raster plate to the first portion, and a second subsystem that directs the projection light emerging from the second optical raster plate to the second portion. Each subsystem may include at least two plane reflecting surfaces that are preferably parallel to each other.

At least one plane reflecting surface of the first subsystem may be configured to be displaced along a displacement direction for changing the position of the first portion of the illuminated field. This is particularly useful if also the size of the first portion can be changed, for example by changing the focal length of the first Fourier optics. If, for example, the size of the first portion is increased and simultaneously the first portion is shifted along a cross-scan direction, it is possible to displace the borderline between the two portions if also the second subsystem and the second Fourier optics are manipulated correspondingly.

Preferably the first portion and the second portion seamlessly abut in the illuminated field. This ensures that the spatial irradiance distribution in the illuminated field is continuous. If a (small) gap remains between the first and the second portion in the illuminated field, also the pattern to be projected on the light sensitive layer has to have a gap at the corresponding position.

In one embodiment there is, in a light path between the first optical raster plate and the illuminated field, a first intermediate field plane which is imaged by a first objective on the first portion of the illuminated field. In a light path between the second optical raster plate and the illuminated field, a second intermediate field plane is provided which is imaged by a second objective on the second portion of the illuminated field. The provision of intermediate field planes facilitates a seamless abutment of the first and the second portions of the illuminated field.

To this end it may be envisaged to arrange a first field stop in the first intermediate field plane and a second field stop in the second intermediate field plane. With the help of the field stops it is possible to ensure sharp edges in the intermediate field planes, and thus also of the portions in the illuminated plane that are images of the fields in the intermediate field plane. Such field stops thus prevent a superposition of light, which comes from the first and the second optical raster plate, in the illuminated field.

It is also possible to provide not only two but three or more portions in the illuminated field in which the illumination setting may be different from each other. For example, a third optical raster plate may be provided, wherein an irradiance distribution of projection light on the third optical raster plate determines an angular light distribution of the projection light exclusively at a third portion of a further illuminated field. If the illumination system further includes stitching optics that combine the illuminated field and the further illuminated field in a single plane, the first, the second and the third portion can be arranged in the illuminated field one behind the other, and with different illumination settings. If also a fourth portion shall be provided, a fourth optical raster plate may produce an angular light distribution of the projection light exclusively on a fourth portion of the further illuminated field with is distinct from the third portion.

Definitions

The term "light" denotes any electromagnetic radiation, in particular visible light, UV, DUV and VUV light.

The term "light ray" is used herein to denote light whose path of propagation can be described by a line.

The term "light bundle" is used herein to denote a plurality of light rays that have a common origin.

The term "light beam" is used herein to denote all light that passes through a particular lens or another optical element.

The term "surface" is used herein to denote any planar or curved surface in the three-dimensional space. The surface may be part of a body or may be completely separated therefrom, as it is usually the case with a field or a pupil plane.

The term "optically conjugate" is used herein to denote an imaging relationship between two points or two surfaces. Thus a light bundle emerging from a point converges at an optically conjugate point.

The term "field plane" is used herein to denote a plane that is optically conjugate to the mask plane.

The term "pupil plane" is used herein to denote a plane in which marginal rays passing through different points in the mask plane or another field plane intersect. As usual in the art, the term "pupil plane" is also used if it is in fact not a plane in the mathematical sense, but is slightly curved so that, in a strict sense, it should be referred to as pupil surface.

The term "condenser" is used herein to denote an optical element or an optical system that establishes (at least approximately) a Fourier relationship between two planes, for example a field plane and a pupil plane. For a Fourier relationship it is characteristic that angles in a field plane translate into positions in a pupil plane, and vice versa. Thus spatial light distribution in a pupil plane corresponds to a certain angular light distribution in a field plane. A synonym for "condenser" is "Fourier optics".

The term "uniform" is used herein to denote a property that does not depend on the position.

The term "spatial irradiance distribution" is used herein to denote how the total irradiance varies over a surface on which light impinges. Usually the spatial irradiance distribution can be described by a function $I_s(x,y)$, with x,y being spatial coordinates of a point in the surface.

The term "angular irradiance distribution" is used herein to denote how the irradiance of a light bundle varies depending on the angles of the light rays that constitute the light bundle. Usually the angular irradiance distribution can be described by a function $I_a(\alpha,\beta)$, with $\alpha,\beta$ being angular coordinates describing the directions of the light rays. If the angular irradiance distribution has a field dependency, $I_a$ will be also a function of field coordinates x,y, i.e. $I_a=I_a(\alpha,\beta,x,y)$.

The term "optical integrator" is used herein to denote an optical system that increases the product NA·a, wherein NA is the numerical aperture and a is the illuminated field area.

The term "optical raster element" is used herein to denote any optical element, for example a lens, a prism or a diffractive optical element, which is arranged, together with other identical or similar optical raster elements, on a common support so that they commonly form an optical raster plate.

BRIEF DESCRIPTION OF THE DRAWINGS

Various features and advantages of the present disclosure may be more readily understood with reference to the following detailed description taken in conjunction with the accompanying drawings in which.

DESCRIPTION OF PREFERRED EMBODIMENTS

I

General Construction of Projection Exposure Apparatus

Figure 1:
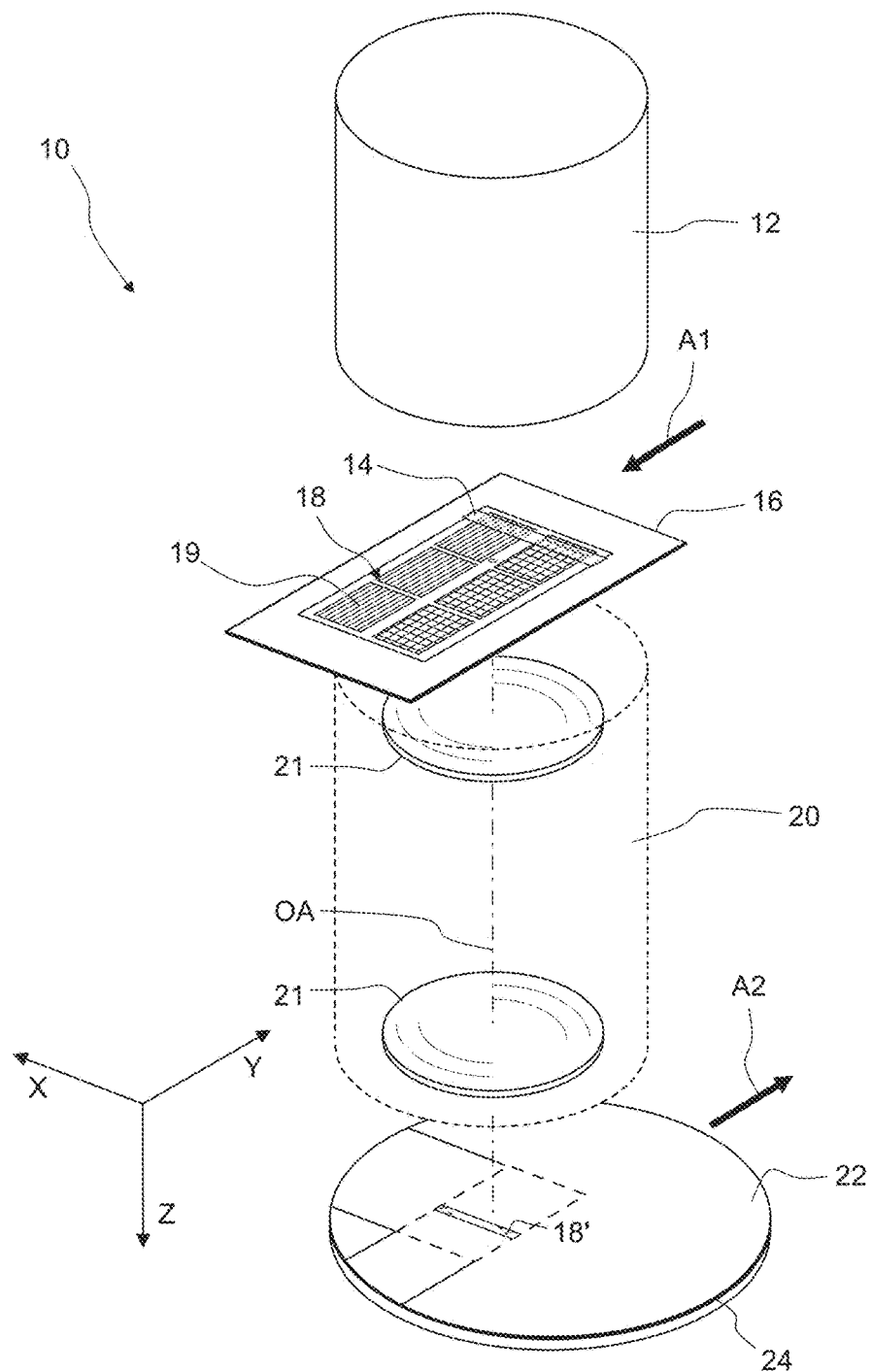
FIG. 1 is a schematic perspective view of a projection exposure apparatus in accordance with one embodiment of the present disclosure.

FIG. 1 is a perspective and highly simplified view of a projection exposure apparatus 10 in accordance with the present disclosure. The apparatus 10 includes an illumination system 12 which produces a projection light beam. The latter illuminates a field 14 on a mask 16 containing a pattern 18 of fine features 19. In this embodiment the illuminated field 14 has a rectangular shape. However, other shapes of the illuminated field 14, for example ring segments, are contemplated as well.

A projection objective 20 having an optical axis OA and including a plurality of lenses 21 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification $\beta$ with $|\beta|<1$, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification $\beta$ of the projection objective 20. If the projection objective 20 inverts the image ($\beta<0$), the mask 16 and the substrate 24 move in opposite directions, as this is indicated in FIG. 1 by arrows A1 and A2. However, the present disclosure may also be used in stepper tools in which the mask 16 and the substrate 24 do not move during the projection of the mask.

II

Multiple Illumination Settings

Figure 2:
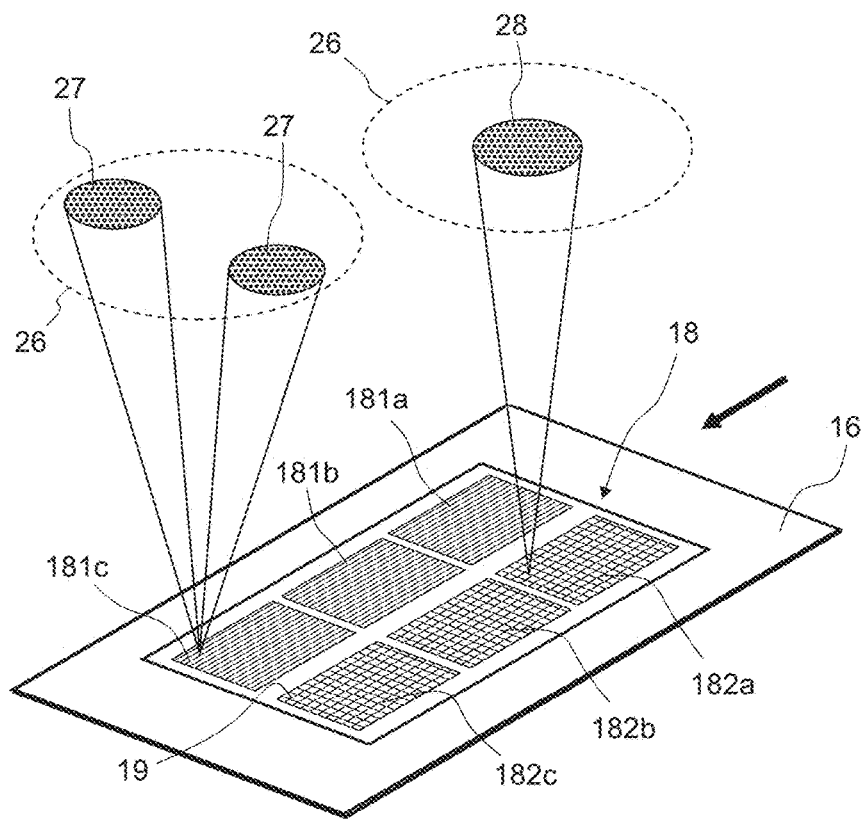
FIG. 2 is a perspective view on a mask and illustrates different illumination settings at different portions of the mask.

FIG. 2 is an enlarged perspective view of the mask 16. For the sake of simplicity, it is assumed that the pattern 18 on the mask 16 includes three first identical pattern areas 181a, 181b, 181c which are arranged one behind the other along the scan direction Y. It is further assumed that the features 19 of the first pattern areas 181a, 181b, 181c are straight lines extending along the scan direction Y.

The pattern 18 further includes three identical second pattern areas 182a, 182b, 182c which are also arranged one behind the other along the scan direction Y, but laterally displaced from the first pattern areas 181a, 181b, 181c so that the first pattern areas 181a, 181b, 181c and the second pattern areas 182a, 182b, 182c have no common X coordinate. It is assumed that the second pattern areas 182a, 182b, 182c contain features 19 extending along the X direction and features 19 extending along the Y direction.

The mask 16 is assumed to be used in a manufacturing step in which two different dies are exposed simultaneously and will be subjected to the same subsequent manufacturing steps such as etching. The dies are small enough so that they can be positioned next to each other within the image field of the projection objective 20 having a width w along the X direction, as it is shown in FIG. 1. Within one complete scanning cycle three dies of a first type associated with the first pattern areas 181a, 181b, 181c and three dies of a second type associated with the second pattern areas 182a, 182b, 182c can be exposed. Then the scanning direction is either reversed, or the mask 16 is returned to its original position without any illumination, and a further scanning cycle is performed. In this way two rows of different dies can be exposed simultaneously on the substrate 24.

Generally different patterns involve different angular irradiance distributions at mask level if an optimum image quality is desired. In this embodiment it is assumed that the features 19 extending along the Y direction are best imaged on the light sensitive layer 22 with an X dipole illumination setting. In FIG. 2 the pupil 26 associated with a light bundle that converges towards a field point located in one of the first pattern areas is indicated by a broken circle. In the pupil 26 two poles 27, which are spaced apart along the X direction, represent directions from which light propagates towards the field point. Since the patterns are assumed to be uniform over the first pattern areas 181a, 181b, 181c, it is thus desirable that this X dipole illumination setting is produced at each field point in the first pattern areas 181a, 181b, 181c.

For the features 19 in the second pattern areas 182a, 182b, 182c it is assumed that a conventional illumination setting results in the best image quality. FIG. 2 indicates a central pole 28 which is illuminated in the pupil 26 associated with a light bundle that converges towards a field point in one of the second pattern areas 182a, 182b, 182c. Again, this conventional illumination setting shall be produced at each field point in the second pattern areas 182a, 182b, 182c.

This implies that the illumination system 12 is capable of producing two different illumination settings simultaneously and side by side within the illuminated field 14. In the following the design of the illumination system 12 which is capable of performing this task will be described in more detail with reference to FIGS. 3 to 11.

III

Design of Illumination System

Figure 3:
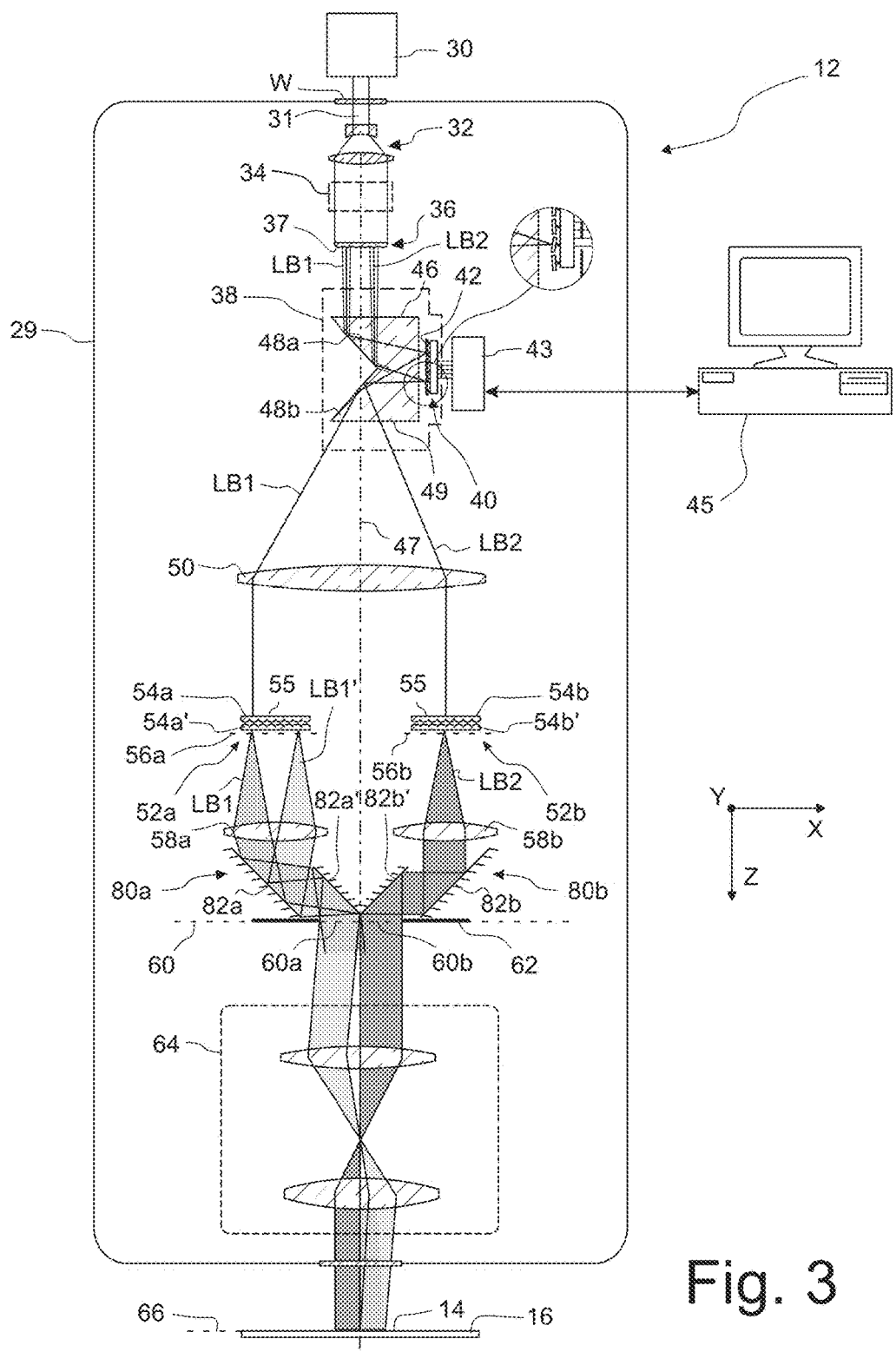
FIG. 3 is a meridional section through an illumination system which is part of the apparatus shown in FIG. 1.

FIG. 3 is a meridional section through the illumination system 12 shown in FIG. 1. For the sake of clarity the illustration of FIG. 3 is considerably simplified and not to scale. This particularly implies that different optical units are represented by one or very few optical elements only. In reality, these units may include significantly more lenses and other optical elements.

The illumination system 12 includes a housing 29 having a light entrance window W through which light from an external light source 30 may enter the illumination system 12. The light source realized, in the embodiment shown, as an excimer laser. The light source 30 emits a beam 31 of projection light having a wavelength of about 193 nm. Other types of light sources 30 and other wavelengths, for example 248 nm or 157 nm, are also contemplated.

In this embodiment the light beam 31 enters a beam expansion unit indicated at 32 in which the light beam is expanded. To this end the beam expansion unit 32 may include several lenses, for example a negative and a positive lens as shown in FIG. 2, and/or several planar mirrors. After the expansion the light beam 31 has still a low divergence, i.e. it is almost collimated.

The expanded light beam 31 enters a beam homogenizing unit 34 which homogenizes the light beam 31 and helps to stabilize the angular distribution of the projection light at mask level. To this end the beam homogenizing unit 34 may include an optical integrator.

Suitable configurations of the beam homogenizing unit 34 are described in US 2010/0283985 A1.

After homogenization the light beam 31 impinges on a beam dividing array 36. The latter divides the light beam 31 into a plurality of individual converging light beams from which only two denoted by LB1, LB2 are shown in FIG. 2. The beam dividing array 36 includes a plurality of small microlenses 37. Suitable configurations of the beam dividing array 36 are disclosed in WO 2012/034571 A1, for example. Alternatively, the beam dividing array 36 may include an array of diffractive optical elements, as it is disclosed in WO 2005/026843 A2 mentioned at the outset, or it may be completely dispensed with.

The converging light beams LB1, LB2 then propagate through a spatial light modulator 38 that is used to produce variable spatial irradiance distributions in two subsequent pupil planes. In this embodiment the spatial light modulator 38 includes an array 40 of micromirrors 42 that can individually be tilted about two orthogonal axes with the help of actuators (not shown). The spatial light modulator 38, and in particular the actuators for the micromirrors 42, are controlled by a control unit 43 which is connected to an overall system control 45.

Figure 4:
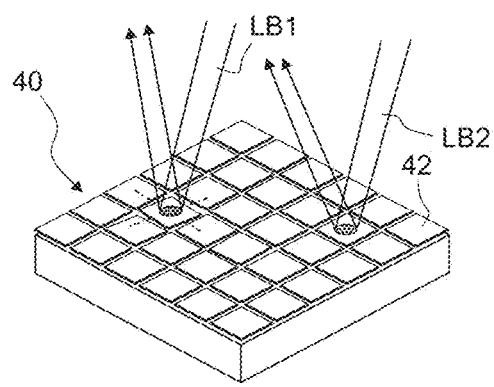
FIG. 4 is a perspective view of a mirror array contained in the illumination system shown in FIG. 3.

FIG. 4 is a perspective view of the array 40 illustrating how the converging light beams LB1, LB2 are reflected into different directions depending on the tilting angles of the micromirrors 42 on which the light beams LB1, LB2 impinge. In FIGS. 3 and 4 the array 40 includes only 66 micromirrors 42; in reality the array 40 may include several hundreds or even several thousands micromirrors 42.

Referring again to FIG. 3, the spatial light modulator 38 further includes a prism 46 having a first planar surface 48a and a second planar surface 48b that are both inclined with respect to an optical axis 47 of the illumination system 12. At these inclined surfaces 48a, 48b the light beams LB1, LB2 are reflected by total internal reflection. The first surface 48a reflects the impinging light beams LB1, LB2 towards the micromirrors 42 of the array 40, and the second surface 48b directs the light beams LB1, LB2 reflected from the micromirrors 42 towards an exit surface 49 of the prism 46.

The directions of the light beams LB1, LB2, and thus the angular irradiance distribution of the light emerging from the exit surface 49 of the prism 46, can therefore be varied by individually tilting the micromirrors 42 of the array 40 around the individual tilt axes. More details with regard to the spatial light modulator 40 can be gleaned from US 2009/0115990 A1, for example.

The angular irradiance distribution produced by the spatial light modulator 38 is transformed into a spatial irradiance distribution with the help of a condenser 50. To this end the spatial light modulator 38 may be arranged in a front focal plane of the condenser 50. Then the projection light emerging from the condenser is approximately collimated when it impinges on two optical integrators 52a, 52b that are spaced apart from each other and will be describe in more detail in the following section IV. If the spatial light modulator 38 is arranged sufficiently far away from the optical integrators 52a, 52b, the condenser 50 may be dispensed with. It is also possible to use a first and a second condenser so that one condenser is associated with only one optical integrator 52a or 52b, respectively.

Each optical integrator 52a and 52b produces a plurality of secondary light sources in a subsequent pupil plane 56a and 56b, respectively. In this embodiment it is assumed that the pupil planes 56a, 56b are arranged immediately behind the rear optical raster plates 54a', 54b'. In other embodiments the pupil planes 56a, 56b may intersect the optical integrators 52a, 52b.

First Fourier optics 58a establish a Fourier relationship between the first pupil plane 56a and a first portion 60a of a field stop plane 60 in which an adjustable field stop 62 is arranged. Similarly, second Fourier optics 58b establish a Fourier relationship between the second pupil plane 56b and a second portion 60b of the field stop plane 60. The first Fourier optics 58a thus superimpose the light beams, which emerge from the secondary light sources in the first pupil plane 56a, in the first portion 60a of the field stop plane 60 so that this first portion 60a is illuminated very homogenously. The same also applies to the second Fourier optics, correspondingly. The two optical integrators 52a, 52b and the separate Fourier optics 56a, 56b ensure that no light from the first optical integrator 52a impinges on the second portion 60b, and no light from the second optical integrator 52b impinges on the first portion 60a.

The first and second portions 60a, 60b seamlessly abut in the field stop plane 60. Since the optical integrators 52a, 52b and the Fourier optics 58a, 58b are spaced apart from each other by a considerable distance, it is desirable to combine the light paths of the projection light passing through the first and second Fourier optics 58a, 58b in the field stop plane 60. To this end the illumination system 12 has a reflective light guiding system that includes a first subsystem 80a that directs the projection light emerging from the first optical integrator 52a to the first portion 60a in the field stop plane 60, and a second subsystem that directs the projection light emerging from the second optical integrator 52b to the second portion 60b. Each subsystem 80a, 80b includes two mirrors 82a, 82a' and 82b, 82b' (or other plane reflecting surfaces such as prism surfaces) that are, in the embodiment shown, parallel to each other.

The field stop plane 60 with its two adjacent portions 60a, 60b is imaged by a field stop objective indicated at 64 onto a mask plane 66 in which the mask 16 supported on a mask stage (not shown) is arranged. Also the adjustable field stop 62 is thereby imaged on the mask plane 66 and defines at least the lateral sides of the illuminated field 14 extending along the scan direction Y. The field stop 62 is controlled such that the illuminated field 14 on the mask is opened and closed at the beginning and the end of each scan cycle, respectively, as this is known in the art as such.

IV

Optical Integrator

In the embodiment shown in FIG. 3 the first optical integrator 52a includes a front optical raster plate 54a and a rear optical raster plate 54a'. Similarly, the second optical integrator 52b includes a front optical raster plate 54b and a rear optical raster plate 54b'.

Figure 5:
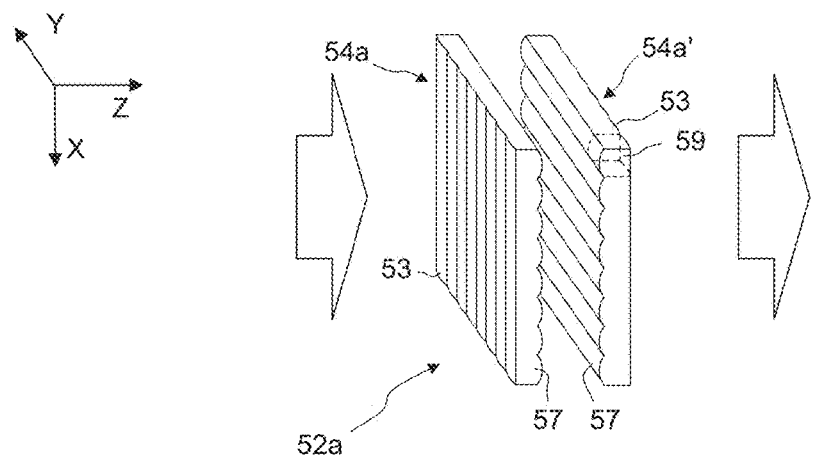
FIG. 5 is a perspective view of an optical integrator that is contained in the illumination system shown in FIG. 3.

FIG. 5 is a perspective view of the optical integrator 52a shown in FIG. 3. Each optical raster plate 54a, 54a' includes two orthogonal arrays of first and second cylindrical microlenses 53, 57 that are arranged on opposite sides of the optical raster plates 54a, 54a'. The second cylindrical microlenses 57 extending along the scan direction Y are more strongly curved as the first cylindrical microlenses 53 extending along the cross-scan direction X. A volume that is confined by two intersecting orthogonal cylindrical microlenses 53, 57 defines an optical raster element 59 having a positive refractive power both along the scan direction Y and the cross-scan direction X. However, due to the different curvatures of the first and second cylindrical microlenses 53, 57, the optical raster elements 59 have a stronger refractive power along the cross-scan direction X than along the scan direction Y.

Figure 6:
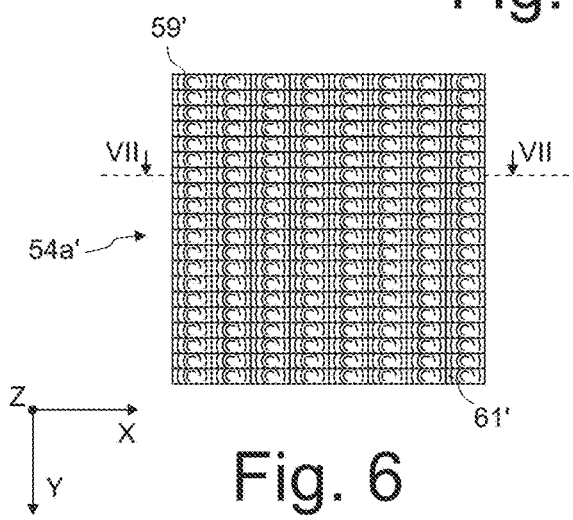
FIG. 6 is a top view on an optical raster plate of an optical integrator according to an alternative embodiment including a plurality of aspherical microlenses each having a rectangular circumference.
Figure 7:
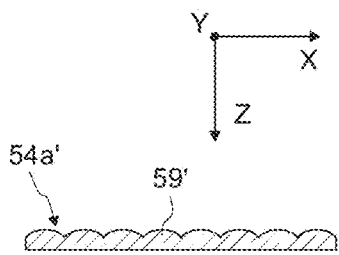
FIG. 7 is a sectional view through the optical raster plate shown in FIG. 6 along line VII-VII.

FIGS. 6 and 7 show an optical raster plate 54a according to an alternative embodiment in a top view and a sectional view along line VII-VII, respectively. In this embodiment the optical raster plate 54a includes a regular array of optical raster elements that are formed by spherical microlenses 59' having a rectangular circumference 61'. The aspect ratio of the circumference 61' is identical to the aspect ratio of the field 14 which is illuminated on the mask 16. Due to the rectangular circumference 61' the microlenses 59' have, similar to the optical raster elements 59 of the optical integrator shown in FIG. 5, a stronger refractive power along the cross-scan direction X than along the scan direction Y.

Figure 8:
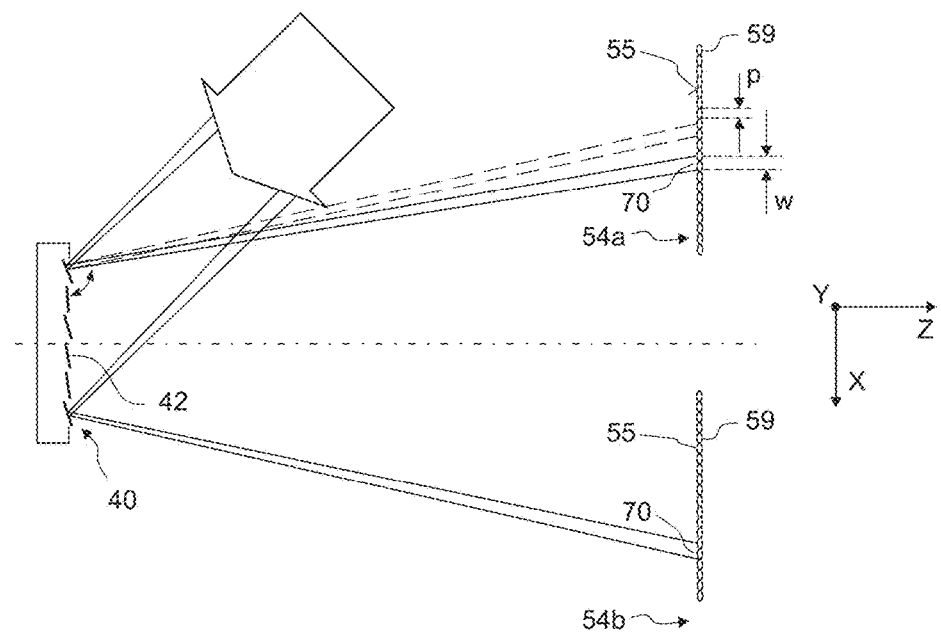
FIG. 8 is a schematic meridional section through the array of micromirrors and two optical raster plates contained in the illumination system shown in FIG. 3.

FIG. 8 shows, in a very schematic representation, the mirror array 40 and the front optical raster plates 54a, 54b of the first and second optical integrators 52a, 52b; the condenser 50 is omitted. For the sake of simplicity the optical raster elements 59 of the optical raster plates 54a, 54b are illustrated here as rotationally symmetrical biconvex lenses.

From each micromirror 42 a light beam emerges which illuminates on the light entrance surface 55 of the optical integrators 52a, 52b a small light spot 70. The position of the light spots 70 can be varied by tilting the micromirrors 42 around the tilt axes, as this is indicated by a double arrow. The shape of the light spots 70 depends, among others, on the optical properties of the micromirrors 42 of the array 40 and of the beam dividing array 36 arranged in front of the spatial light modulator 38. The shape of the light spots 70 may be circular; in other embodiments the shape may be elliptical or approximately rectangular, in particular square.

In this embodiment the width w of the light spots 70 along the cross scan direction X is larger than the pitch p of the optical raster elements 59 along this direction. In some embodiments the width w of the light spots 70 is about 2·p or 5·p, but less than 25·p along the cross scan direction X. However, the width w may also be smaller than the pitch p.

Each portion of the light entrance surface 55, which is exclusively associated with a single optical raster element 59, is imaged, via the corresponding optical raster element 59 of the rear optical raster plate 54a', 54b' and the second condenser 58, on the field stop plane 60.

Figure 9:
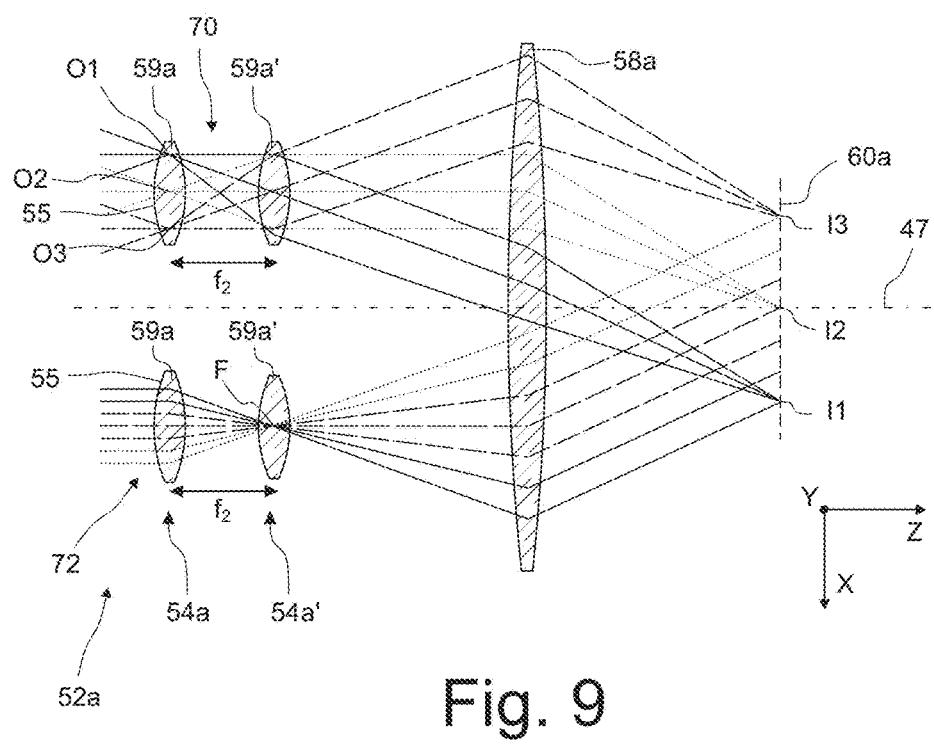
FIG. 9 is a schematic meridional section through two optical channels formed in the optical integrators of the illumination system shown in FIG. 3.

This will now be explained with reference to FIG. 9 that shows a portion of the first optical integrator 52a, the first Fourier optics 58a and the first portion 60a of the field stop plane 60. Pairs of front and rear optical raster elements 59a and 59a', respectively, that are arranged along lines extending parallel to the optical axis 47, form an optical channel from which only two denoted by 70, 72 are shown in FIG. 9. Each optical channel 70, 72 has the property that projection light is, at least if diffraction is disregarded, confined to the respective channel 70, 72 once it has entered the front optical raster element 59a of this optical channel.

A characterizing feature of optical integrators is generally that the front optical raster elements 59a are arranged in the front focal plane of the rear optical raster elements 59a'. The front focal plane is spaced apart from the rear optical raster elements 59a' by their focal length $f_2$. Since the rear optical raster elements 59a' of the rear optical raster plate 54a' are arranged in the front focal plane of the first Fourier optics 58a, the irradiance distribution within each front optical raster element 59a is imaged on the back focal plane of the first Fourier optics 58a, i.e. the first portion 60a of the field stop plane 60. This is illustrated in the upper portion of FIG. 9 for three object points O1, O2, O3 which are imaged by the rear optical raster element 59a' and the first Fourier optics 58a on image points I1, I2 and I3, respectively. The entrance facets of the front optical raster plate 54a, which are associated with the channels 70, 72, are therefore optically conjugate to the first portion 60a of the field stop plane 60 and, by virtue of the field stop objective 64, also to a corresponding portion in the mask plane 66.

From FIG. 9 it becomes also clear that each optical channel 70, 72 illuminates the same area confined by the marginal image points I1 and I3 in the first portion 60a of the field stop plane 60. Thus the spatial irradiance distributions on the first optical raster elements 59a, which may slightly differ, are superimposed in the first portion 60a of the field stop plane 60. This superposition results in a very uniform spatial irradiance distribution in the first portion 60a of the field stop plane 60.

In the lower half of FIG. 9 the conditions are shown if parallel projection light impinges on the front optical raster elements 59a. Since, in this embodiment, the focal length $f_1$ of the front optical raster elements 59a is equal to the focal length $f_2$, the focal point F where the parallel light converges is located inside the rear optical raster elements 59a'. Generally, however, the focal lengths $f_1$ and $f_2$ may be different. Again it can be seen that, as a result of the optical conjugation, the region where a light bundle impinges on a front optical raster element 59a corresponds to the region which is illuminated by this optical channel in the first portion 60a of the field stop plane 60.

V

Function

Figures 10, 11:
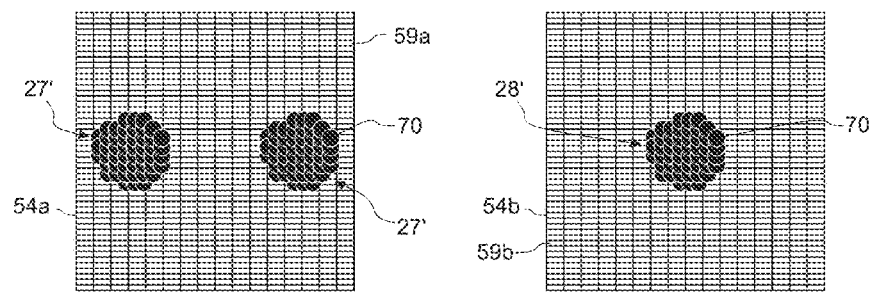
FIG. 10 illustrates an exemplary irradiance distribution on one of the optical integrators.
FIG. 11 is an exemplary irradiance distribution on the other of the two optical integrators.

For producing the angular irradiance distributions (i.e. illumination settings) on the mask 16 as they are shown in FIG. 2, the control unit 43 controls the micromirrors 42 of the spatial light modulator 38 so that the spatial irradiance distributions shown in FIGS. 10 and 11 are produced on the front optical raster plates 54a, 54b. It can be seen in FIG. 10 that on the first front optical raster element 54a the irradiance distribution consists of two poles 27' that correspond to the poles 27 shown in FIG. 2. The poles 27' are obtained by superimposing a plurality of spots 70 that are associated with the micromirrors 42.

As can be seen in FIG. 11, only a single pole 28' is produced on the second front optical raster element 54b by superimposing other spots 70. The pole 28' corresponds to the pole 28 shown in FIG. 2. The number of spots 70 that contribute to the pole 28' is twice as large as the number of spots 70 that superimpose in each of the poles 27'. This ensures that the irradiances in the two portions 60a, 60b, and thus in the pattern portions 181a, 181b, 181c and 182a, 182b, 182c on the mask 16, are identical.

As it has been explained above, the irradiance distributions on the front optical raster elements 54a, 54b as shown in FIGS. 10 and 11 correspond to the irradiance distributions in the pupil planes 56a and 56b, respectively. This is because an illuminated optical channel as shown in FIG. 9 produces a secondary light source in the pupil plane 56a or 56b, whereas optical channels on which no projection light impinges remain dark. Therefore the secondary light sources associated with the poles 27' shown in FIG. 10 illuminate the first portion 60a from two opposite sides along the cross-scan direction X, as this is shown for two light bundles LB1 and LB1' in FIG. 3. It can be seen that each light bundle LB1, LB1' illuminates the entire portion 60a, but from different directions. The larger the poles 27' are spaced apart from each other, the more will the directions differ from which projection light impinges on the first portion 60a.

Similar considerations apply also to the second front optical raster plate 54b. In FIG. 3 a single light bundle LB2 is shown that is produced by one of the secondary light sources being associated with an on-axis optical raster element 59 that is covered by the pole 28'. This light bundle LB2 emerges as collimated light bundle from the second Fourier optics 58b and thus illuminates the second portion 60b not obliquely, but perpendicularly. Light bundles emerging from off-axis secondary light sources illuminate the second portion 60b obliquely, but with smaller angles than the light bundles LB1, LB1' produced by the first optical integrator 52a. In this manner the angular light distributions shown in FIG. 2 are produced in the portions 60a and 60b. Since the portions 60a, 60b are imaged on the mask 16 by the field stop objective 64, these angular light distributions are reproduced on the mask 16. If the field stop objective 64 has a magnification M with $|M| \neq 1$, it modifies the angular light distribution quantitatively.

VI

Other Embodiments a) Changing Size of Portions 60a, 60b

Figure 12:
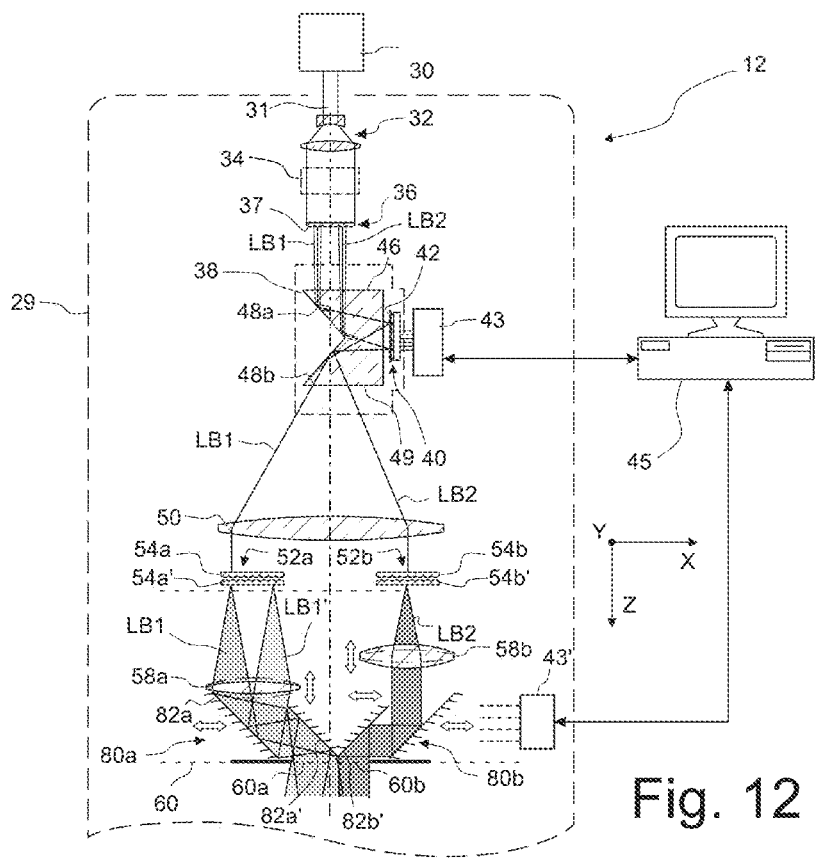
FIG. 12 is a meridional section through an illumination system according to a second embodiment in a representation similar to FIG. 3, in which the size of the portions with different illumination settings can be changed.

FIG. 12 shows a second embodiment of an illumination system 12 in a representation similar to FIG. 3. Since the field stop objective 64 is the same in this embodiment, the lower portion of the illumination system 12 is not shown again.

In the second embodiment the first and the second Fourier optics 58a, 58b have a first focal length and a second focal length that are variable in response to a focal length change command signal from the overall system control 45. Additionally, the front focal plane of the first and second Fourier optics 58a, 58b is kept in the same position irrespective of the focal length. In FIG. 12 the Fourier optics 58a, 58b are represented by lenses that have a variable thickness and can be axially displaced, as this is indicated by double arrows. In a real system the Fourier optics 58a, 58b would rather be realized as multi-lens optical systems in which the principal planes of a plurality of lenses are axially displaced.

It can be seen in FIG. 12 that with these variable Fourier optics 58a, 58b the diameter of the light bundles emerging from the secondary light sources and illuminating the portions 60a, 60b can be changed. Here it is assumed that the first Fourier optics 58a has a reduced refractive power and is displaced away from the first optical integrator 52a. Therefore the light bundles have an increased diameter. The second Fourier optics 58b has an increased refractive power and has been arranged closer to the second optical integrator 52b. In this way the diameters of the light bundles produced by the secondary light sources became smaller.

By displacing at least some of the reflective surfaces 82a, 82a' and 82b, 82b' it is possible to laterally displace the light bundles that illuminate the portions 60a, 60b. These displacements are indicated in FIG. 12 by horizontal double arrows. By increasing the diameter of the light bundles LB1, LB1' and shifting them to the right in FIG. 12 and, similarly, by decreasing the diameter of the light bundle LB2 and shifting it also to the right, the size of the first and second portions 60a, 60b can be changed within certain extents. In this way also masks 16 can be illuminated with different illumination settings in which the pattern portions 181a, 181b, 181c and 182a, 182b, 182c have different dimensions along the cross-scan direction X.

The movements of the lenses in the first and second Fourier optics 58a, 58b and of the reflective surfaces 82a, 82a', 82b, 82b' are coordinated by a further control unit 43' which is also connected to the overall system control 45.

Since the change of the focal length of the Fourier optics 58a, 58b has also an impact on the angular light distributions, it may become desirable to compensate this effect by a modified illumination of the optical integrators 52a, 52b. This modification is calculated by the system control 45 and results in a modified control of the micromirrors 42 of the spatial light modulator 38.

Since the diameter of the light bundles illuminating the portions 60a, 60b change also along the scan direction Y, which is usually not desired, the first and second Fourier optics 58a, 58b may be anamorphotic. This means that they have different focal lengths in the XZ plane and the YZ plane. For changing the width of the first and second portion 60a, 60b along the cross-scan direction X only, the focal length in the XZ plane is variable, while the focal length in the YZ plane remains constant. Since anamorphotic Fourier optics 58a, 58b also have an impact on the angular light distribution, this is again compensated by a modified control of the micromirrors 42.

b) Seamless Abutment of Portions 60a, 60b

In the foregoing it has been mentioned that the two portions 60a, 60b are arranged adjacent to each other. Since the portions 60a, 60b are obtained by a superposition of light from a large number of secondary light sources, the edges of the portions 60a, 60b are usually not perfectly sharp. This not only involves the provision of the field stop 62, but may also imply that the portions 60a, 60b should be separated by a small gap. Otherwise it cannot be reliably ensured that no light from the first optical integrator 54a and having a first angular light distribution impinges on the second portion 60b, and vice versa.

Figure 13:
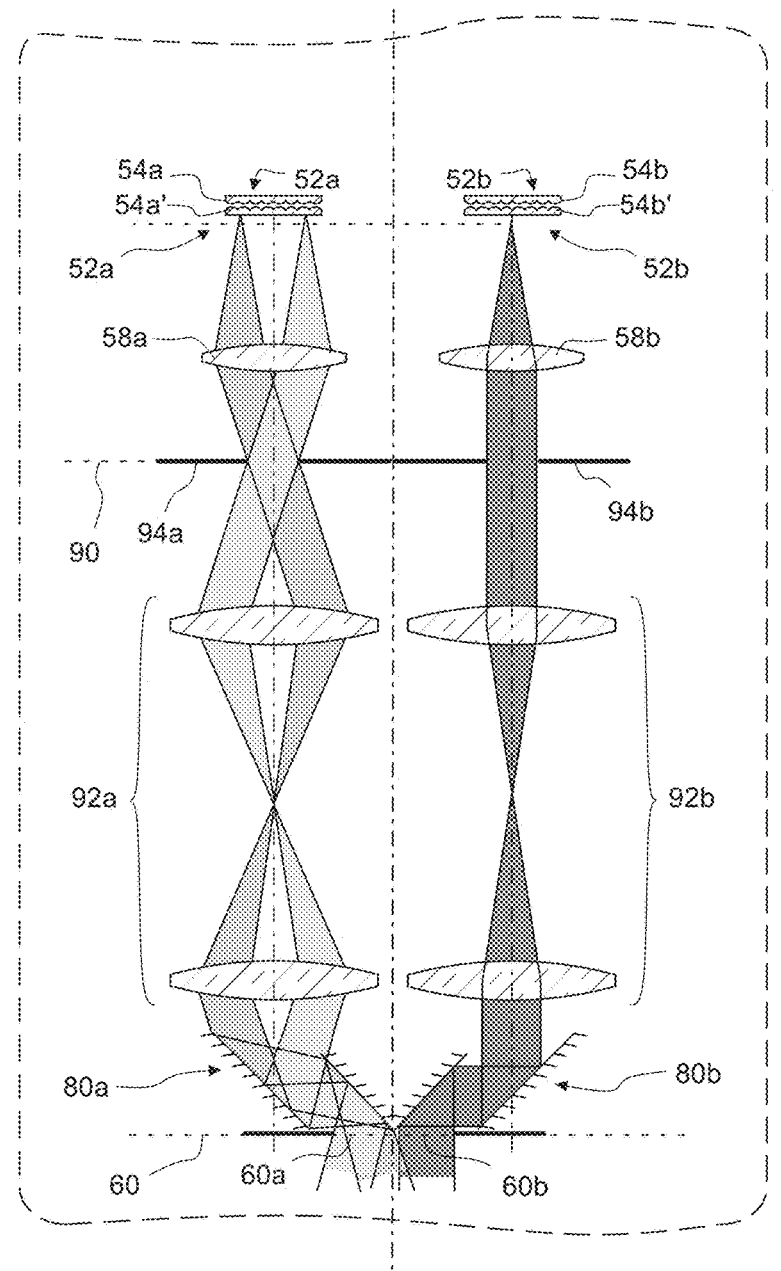
FIG. 13 is a partial meridional section through an illumination system according to a third embodiment in which an objective images an intermediate field plane on a field stop plane.

If a gap between the portions 60a, 60b shall be avoided, it may be envisaged to produce the portions 60a, 60b in an intermediate field plane 90 which is imaged by objectives 92a, 92b on the field stop plane 60, as this is shown in FIG. 13. In the intermediate field plane a first field stop 94a and a second field stop 94b are arranged that may have—if the Fourier optics 58a, 58b have a fixed focal length—a diaphragm with a circular opening whose diameter is fixed. If the focal length of the Fourier optics 58a, 58b can be varied, as this has been described above with reference to FIG. 12, the diameter of the opening is variable, too.

The first and second field stop 94a, 94b ensure sharp edges of the portions 60a, 60b in the field stop plane 60. Thus the two portions 60a, 60b may abut substantially seamlessly on each other so that the illumination setting changes almost abruptly over a very short distance along the cross-scan direction X.

c) More than Two Portions

Spatial restrictions usually make it difficult to produce three or more portions with different angular light distributions with a setup as shown in FIG. 3. However, it is possible to use two or more of the setups as shown in FIG. 3 and to combine the portions with different angular light distributions using stitching optics.

Figure 14:
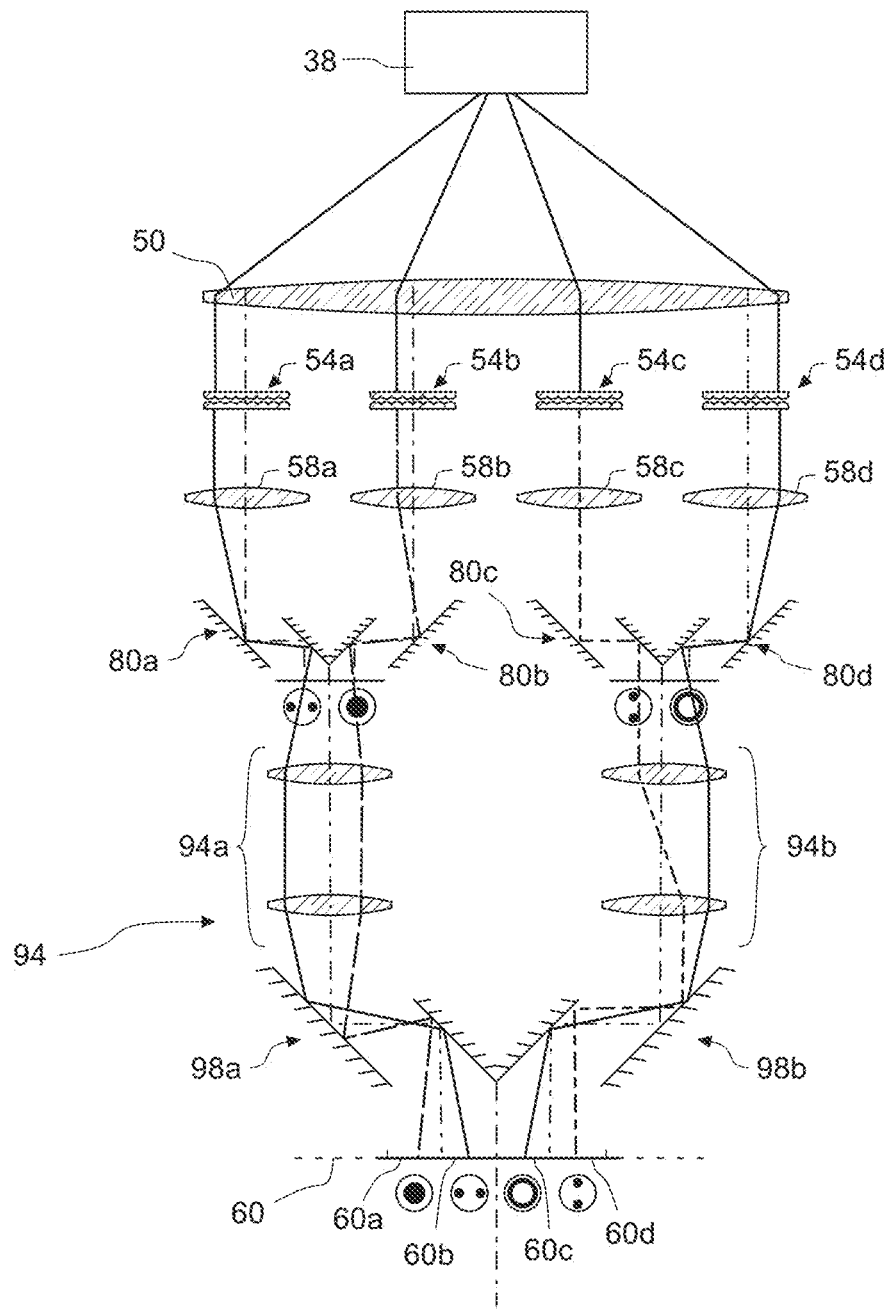
FIG. 14 is a schematic meridional section through an illumination system according to a fourth embodiment in which four different portions in the illuminated field are illuminated with different angular light distributions.

FIG. 14 is a very schematic illustration how this may be accomplished. In this fourth embodiment it is assumed that a single spatial light modulator 38 illuminates via a single condenser 50 four optical integrators 54a, 54b, 54c and 54d. Light emerging from the optical integrators 54a, 54b passes through first and second Fourier optics 58a, 58b and light guiding subsystems 80a, 80b in the same manner as this is shown in FIG. 3. Similarly, light from the third and fourth optical integrators 54c, 54d is guided through third and fourth Fourier optics 58c, 58d and is combined using light guiding subsystems 80c and 80d.

Stitching optics 94 image the portions 60a, 60b and 60c, 60d in the field stop plane 60 so that the second portion 60b and the third portion 60c seamlessly abut. The stitching optics 94 consists of two objectives 96a, 96b and light guiding subsystems 98a, 98b which bring the image planes of the objectives 96a, 96b closely together in the field stop plane 60.

In FIG. 14 circular symbols in the different light paths represent exemplary illumination settings that can be produced separately in the four adjacent portions 60a, 60b, 60c and 60d. For changing the illumination setting in each portion, the irradiance distribution on the respective optical integrator 52a, 52b, 52c or 52d has to be modified accordingly, as this has been explained above with reference to FIG. 3.

What is claimed is:

1. An illumination system of a microlithographic projection exposure apparatus, the illumination system comprising:
   a first optical raster plate configured so that an irradiance distribution of projection light on the first optical raster plate determines an angular light distribution of the projection light exclusively at a first portion of an illuminated field;
   a second optical raster plate configured so that an irradiance distribution of the projection light on the second raster plate determines an angular light distribution of the projection light exclusively at a second portion of the illuminated field which is arranged adjacent to the first portion of the illuminated field;
   first Fourier optics configured to establish a Fourier relationship between the first portion of the illuminated field and a first pupil plane, which intersects, or is arranged in close proximity to, the first optical raster plate;
   second Fourier optics configured to establish a Fourier relationship between the second portion of the illuminated field and a second pupil plane, which intersects, or is arranged in close proximity to, the second optical raster plate; and
   a reflective light guiding system,
   wherein:
      the first and second Fourier optics have a first focal length and a second focal length, respectively, that are variable in response to a focal length change command signal from a control unit;
      the reflective light guiding system comprises:
         a first subsystem configured to direct the projection light emerging from the first optical raster plate to the first portion; and
         a second subsystem configured to direct the projection light emerging from the second optical raster plate to the second portion;

the first subsystem comprises two plane reflecting surfaces;

the second subsystem comprises two plane reflecting surfaces; and the first subsystem comprises a plane reflecting surface that is displaceable along a displacement direction to change the position of the first portion of the illuminated field.

2. The illumination system of claim 1, further comprising a spatial light modulator configured to produce the irradiance distribution on the first optical raster plate.

3. The illumination system of claim 2, wherein the spatial light modulator is configured to produce the irradiance distribution on the second optical raster plate.

4. The illumination system of claim 3, wherein the spatial light modulator is configured to vary positions of light spots on the first optical raster plate in response to a command signal received from the control unit.

5. The illumination system of claim 4, wherein:
the spatial light modulator comprises an array of beam deflecting elements;
each beam deflecting element is individually capable of deflecting impinging light in a direction which depends on the command signal received from the control unit; and
each light spot is associated with exactly one beam deflecting element.

6. The illumination system of claim 5, further comprising a reflective light guiding system configured to direct projection light emerging from the first optical raster plate and projection light emerging from the second optical raster plate to the illuminated field.

7. The illumination system of claim 6, wherein the first and second portions seamlessly abut in the illuminated field.

8. The illumination system of claim 2, wherein the spatial light modulator is configured to vary positions of light spots on the first optical raster plate in response to a command signal received from the control unit.

9. The illumination system of claim 8, wherein:
the spatial light modulator comprises an array of beam deflecting elements;
each beam deflecting element is individually capable of deflecting impinging light in a direction which depends on the command signal received from the control unit; and
each light spot is associated with exactly one beam deflecting element.

10. The illumination system of claim 9, further comprising a reflective light guiding system configured to direct projection light emerging from the first optical raster plate and projection light emerging from the second optical raster plate to the illuminated field.

11. The illumination system of claim 10, wherein the first and second portions seamlessly abut in the illuminated field.

12. The illumination system of claim 1, further comprising a reflective light guiding system configured to direct projection light emerging from the first optical raster plate and projection light emerging from the second optical raster plate to the illuminated field.

13. The illumination system of claim 12, wherein the first and second portions seamlessly abut in the illuminated field.

14. The illumination system of claim 1, wherein the first and second portions seamlessly abut in the illuminated field.

15. The illumination system of claim 14, wherein:
a first intermediate field plane is in a light path between the first optical raster plate and the illuminated field;

the first intermediate plane is imageable, via a first objective. on the first portion of the illuminated field;

a second intermediate field plane is in a light path between the second optical raster plate and the illuminated field; and the second intermediate plane is imageable, via a second objective, on the first portion of the illuminated field.

16. The illumination system of claim 15, further comprising first and second field stops, wherein the first field stop is in the first intermediate field plane, and the second field stop is in the second intermediate field plane.

17. The illumination system of claim 1, further comprising a third optical raster plate and stitching optics, wherein:
the illumination system is configured so that an irradiance distribution of projection light on the third optical raster plate determines an angular light distribution of the projection light exclusively at a third portion of a further illuminated field; and
the stitching optics is configured to combine the illuminated field and the further illuminated field in a single plane.

18. The illumination system of claim 17, further comprising a spatial light modulator configured to produce the irradiance distribution on the first optical raster plate.

19. An apparatus, comprising:
an illumination system, comprising:
a first optical raster plate configured so that an irradiance distribution of projection light on the first optical raster plate determines an angular light distribution of the projection light exclusively at a first portion of an illuminated field;
a second optical raster plate configured so that an irradiance distribution of the projection light on the second raster plate determines an angular light distribution of the projection light exclusively at a second portion of the illuminated field which is arranged adjacent to the first portion of the illuminated field;
first Fourier optics configured to establish a Fourier relationship between the first portion of the illuminated field and a first pupil plane, which intersects, or is arranged in close proximity to, the first optical raster plate;
second Fourier optics configured to establish a Fourier relationship between the second portion of the illuminated field and a second pupil plane, which intersects, or is arranged in close proximity to, the second optical raster plate; and
a reflective light guiding system; and
a projection objective,
wherein:
the first and second Fourier optics have a first focal length and a second focal length, respectively, that are variable in response to a focal length change command signal from a control unit;
the reflective light guiding system comprises:
a first subsystem configured to direct the projection light emerging from the first optical raster plate to the first portion; and
a second subsystem configured to direct the projection light emerging from the second optical raster plate to the second portion;
the first subsystem comprises two plane reflecting surfaces;
the second subsystem comprises two plane reflecting surfaces; and the first subsystem comprises a plane reflecting surface that is displaceable along a displacement direction to change the position of the first portion of the illuminated field.

20. A method, comprising:
providing the apparatus of claim 19;
using the illumination system to illuminate features of a mask; and
using the projection objective to image the illuminated features of the mask onto a light sensitive material.

* * * * *

UNITED STATES PATENT AND TRADEMARK OFFICE
CERTIFICATE OF CORRECTION

PATENT NO. : 10,281,823 B2  
APPLICATION NO. : 15/803304  
DATED : May 7, 2019  
INVENTOR(S) : Markus Deguenther Page 1 of 1

It is certified that error appears in the above-identified patent and that said Letters Patent is hereby corrected as shown below:

On the Title Page

Item (57), Column 2 (Abstract), Line 12: Delete "one" and insert -- on --, therefor. (First Occurrence)

In the Specification

Column 5, Line 13 (approx.): Delete "accusto-optical" and insert -- acousto-optic --, therefor.

In the Claims

Column 18, Lines 1-2: In Claim 15, delete "objective." and insert -- objective --, therefor.

Signed and Sealed this  
Twenty-third Day of July, 2019

Andrei Iancu  
*Director of the United States Patent and Trademark Office*